United States Patent
Surico

(10) Patent No.: US 7,284,144 B2
(45) Date of Patent: Oct. 16, 2007

(54) FINITE STATE MACHINE INTERFACE HAS ARBITRATION STRUCTURE TO STORE COMMAND GENERATED BY INTERNAL CIRCUITS DURING EVALUATION PHASE OF STATE MACHINE FOR FLASH EEPROM DEVICE

(75) Inventor: Stefano Surico, Taranto (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1233 days.

(21) Appl. No.: 10/309,759

(22) Filed: Dec. 4, 2002

(65) Prior Publication Data

US 2003/0126204 A1  Jul. 3, 2003

(30) Foreign Application Priority Data

Dec. 4, 2001  (EP) .................................. 01830744

(51) Int. Cl.
*G06F 1/04* (2006.01)
(52) U.S. Cl. ....................................... 713/600; 713/500
(58) Field of Classification Search ................ 713/500, 713/600
See application file for complete search history.

(56) References Cited

U.S. PATENT DOCUMENTS

| | | | | |
|---|---|---|---|---|
| 4,818,932 A | * | 4/1989 | Odenheimer | 324/121 R |
| 5,333,300 A | | 7/1994 | Fandrich | 395/550 |
| 5,386,518 A | * | 1/1995 | Reagle et al. | 710/316 |
| 5,444,858 A | * | 8/1995 | Wakerly | 713/600 |
| 5,796,992 A | * | 8/1998 | Reif et al. | 713/500 |
| 6,243,829 B1 | * | 6/2001 | Chan | 714/7 |
| 6,754,786 B2 | * | 6/2004 | Suzuki et al. | 711/150 |
| 6,779,125 B1 | * | 8/2004 | Haban | 713/500 |
| 7,007,111 B2 | * | 2/2006 | Sihlbom et al. | 710/36 |
| 7,007,131 B2 | * | 2/2006 | Kendall et al. | 711/103 |

OTHER PUBLICATIONS

Nowick et al., Synthesis of Asynchronous State Machines Using a Local Clock, Proceedings of the International Conference on Computer Design—VLSI in Computers and Processors, Cambridge, MA, Oct. 14-16, 1991, Comp. Soc. Press, pp. 192-197, XP010025205.

Tinder et al., High-Speed Microprogrammable Asynchronous Controller Modules, Transactions on Computers, New York, vol. 43, No. 10, Oct. 1, 1994, pp. 1226-1232, XP000474493.

* cited by examiner

Primary Examiner—Chun Cao
(74) Attorney, Agent, or Firm—Lisa K. Jorgenson; Allen, Dyer, Doppelt, Milbrath & Gilchrist, P.A.

(57) ABSTRACT

An interface is provided for an integrated system that includes internal circuits, with each internal circuit functioning based upon its own clock. The interface includes a finite state machine for managing asynchronous and independent interactions between the internal circuits and external circuits. The finite state machine functions based upon a unique clock and a unique reset. The interface also includes an arbitration circuit connected to the finite state machine for receiving input signals for the finite state machine. The arbitration circuit includes a memory buffer for storing signals generated by the internal circuits when the finite state machine is performing an evaluation. The interface may be used to form a command interpreter of a non-volatile memory device.

25 Claims, 10 Drawing Sheets

FINITE STATE MACHINE INTERFACE HAS ARBITRATION STRUCTURE TO STORE COMMAND GENERATED BY INTERNAL CIRCUITS DURING EVALUATION PHASE OF STATE MACHINE FOR FLASH EEPROM DEVICE

FIELD OF THE INVENTION

The present invention relates to finite state machines, and in particular, to a method of managing an interface based on a finite state machine and an architecture associated therewith.

BACKGROUND OF THE INVENTION

Often in digital and digital-analog integrated circuits it is necessary to include a finite state machine that operates as an interface between the external circuitry (user) and one or more internal functional circuits, such as counters, microcontrollers, converters, and the like. Such a structure must be able to update its internal state to give a precise indication of the working condition of the device at every instant, and should also be able to receive user commands and communicate the information (if so required) to certain functional circuits, wait for their response, run embedded algorithms, signal the end of these algorithms, etc.

Often, the interface performs a true handshake among the external circuits and one or more internal circuits. The interface assumes a basic role and any malfunctions, even in just one of the tasks that it carries out, may in some cases cause an interruption of communications, and consequently, require a hardware reset of the whole integrated circuit for a new start from the initial conditions.

The specifications to be satisfied by this type of structure may be subdivided in two categories:

1) The interface may modify its own state only upon a user clock pulse (CLK), and in this phase, it will carry out its own evaluation based on the values present at the external inputs as well as on signals coming from the internal circuits with which it interfaces. In this case, the interface acts only upon reception of a user command taking into account all information provided to it. Its functioning is akin to the work of an employee who acts on command from a single boss (external circuits), taking into account what his colleagues (internal circuits) have communicated to him.

2) The interface may modify its state upon commands coming from one or several internal circuits (from peer circuits). In this case, its functioning is akin to that of an employee that carries out tasks assigned to him from time to time by two or more bosses, without any allowance for missing performance of any of the received commands, unless recognizably useless.

Typically, in such circuits, operation requests coming from external circuits are of various kinds and rather complex and are issued in the form of a bit sequence, the combinations of which must be suitably encoded and correspond, in general, to tens of possible commands. On the contrary, the handshake with any of the relevant internal circuits takes place through the communication of just a few bits (often a single bit or flag) that signals an acknowledge or an end operation.

The considerations that will be made in the following description and the invention relate to interface structures belonging to the second category. The specifications of these interface structures are relatively more burdening and complex than those of an interface structure belonging to the first category.

The relative complexity of the design of these interfaces of the second category derives from the fact that the specification of these structures does not allow for a straightforward identification of an appropriate design of a suitable state machine according to classic design rules established in the literature. In fact, various methods for the implementation of synchronous machines may be found in the literature, but they are all based on the assumption that they work with a single clock and with a single reset.

Conventionally, the variety of commands is peculiar of and attributed to external commands, while in contrast the internal circuits communicate among them through simple acknowledge signals. According to the designs so far practiced, the state machine (also referred to as SM throughout the description) is considered as a synchronous machine that receives its clock from external circuits and manages the interaction with the internal circuits in an asynchronous mode by resetting the bistable state circuits (FF) according to conditions based on information coming from the internal circuits.

Assuming that, upon recognizing a proper sequence of user commands, the SM reaches a state that is determined by the setting of the bistable state circuits, which causes the start of a certain embedded operation by the device. When such an operation has been completed, to resume the initial condition it is possible to use an ENDOP signal (End Operation) generated by the internal circuit that performs the operation to reset the bistable state circuits, and eventually other synchronous circuits that had changed their state upon the recognition of the input sequence.

In certain applications, the reset is done by a very short pulse (of minimum duration), as will be better highlighted below. In other applications, certain state bistable state circuits receive the user clock, other bistable state circuits have their own clock pin coupled to handshake signals with the internal circuits such that upon an internal communication, a bistable state circuit sets. This instantaneously changes the global state of the machine, but the same bistable state circuits must be reset after propagation of the event through a circuit chain. There are also applications in which both reset mechanisms are used in combination.

By considering the interface as a single large finite state machine, it may be observed that in the first type of applications it uses a single (user) clock but a multiple reset, while in the second type of applications it uses a multiple clock (in the sense that different bistable state circuits have different signals on their respective CLK pins).

In the case of applications implementing a hybrid mechanism, there may be state variables with multiple clocks and multiple reset signals. Drawbacks of all these approaches may be summarized as follows.

Wide windows not sensitive to commands. In particular, it must be observed that where a pulse deriving from an internal communication is used to reset the state variables, the pulse must last to ensure reset in all temperature and supply voltage limits. This implies that, during such a reset pulse, eventual user commands will not be accepted, irrespective of their importance.

Complex design. Design complexity increases because in order to cover all possible situations, it is not easy to resolve such a complexity in a few common circuits. On the contrary it is necessary to use a large number of different combination and sequential sub-circuits, whereby each of them must store reset conditions for other sequential circuits that eventually must close the loop by resetting the first ones.

Difficult to reproduce. These structures are specifically designed for solving a particular problem so that when a new device compliant to a different specification is needed, the design must be completely overhauled.

Area occupation. The difficulty of solving the circuit complexity with a standard structure using a single clock and a single reset severely hinders optimization during the phase of automatic synthesis. Basically, while in a standard structure it could be possible to obtain a four flip-flop synthesis requiring about ten memory elements based upon the circuitry according to the above mentioned known approaches. The greater the number of states to be managed, the greater is this proliferation effect.

Difficult to test. If the whole interface could summarize its current state on a bus of state variables of a few bits concentrated in a common area, it would be easy, in a test mode, to force a state, let the structure evolve, and read the state in which the structure evolves after an evaluation. The above discussed approaches, because of their inherent complexity, are difficult to test.

Any tutorial documents pertaining to digital designs invariably stress that for synchronous structures, the design approaches to be followed are the ones leading to the maximum uniformity of the clock and the reset of all bistable state circuits. On the other hand, the above mentioned specifications are satisfied with great difficulty by following such design approaches, as the circuit structures of known commercial devices amply demonstrate.

SUMMARY OF THE INVENTION

A different approach that is very effective in overcoming the above discussed difficulties and drawbacks of the known approaches is that of designing an interface circuit that is substantially definable as a state machine operating with a single CLK command and with a single reset command (the latter common to all the logic circuits of the device) that is responsive to operate at a rate such that each new command does not arrive before the current evaluation has been correctly concluded, while respecting the set up and hold times on the inputs.

A state machine having these features would fall into standard categories and would be suitable for a VHDL description referred to as a MOORE or a MEALY machine, or the like, depending on the needs. Furthermore, such a state machine, upon being designed by an automatic synthesizer, would lead to an optimized synthesis even from the point of view of the area requirements.

The problem of adapting a specification that imposes the possibility of independent and close asynchronous interactions (because of the absence of a protocol that coordinates the actions of the external circuits with respect to the actions of the internal circuits) with a single clock command (CLK) structure that excludes the possibility of multiple commands, has been addressed by defining an arbitration structure that adapts certain requirements of the specification to a certain state machine having standard characteristics.

The tasks of such an arbitration structure includes detecting all the external requests; and detecting the condition (free or in the course of carrying out an evaluation) of the single clock state machine, and depending on it, sorting and cueing the requests while taking into account the following. Commands are only passed to the state machine when it is able to carry them out (when there is not any other evaluation in progress), and the data (on respective inputs of the SM) necessary to produce a correct evaluation is eventually provided. All the requests are detected, and it is decided which are to be stored for carrying them out as soon as possible, and which to filter (eliminate) if recognized as influential or useless.

Basically, the method of managing a finite state machine, according to the invention, is commanded through an interface or input arbitration circuit having a memory buffer in which any command to be carried out may be stored, by issuing a command through data inputs of the finite state machine and by applying a clock signal to a single clock input of the finite state machine. The method may comprise the following steps:

a) for each new command, verifying whether it is received while the state machine is carrying out a previously received command or not;

b) if step a) is negative, conveying the command to the finite state machine either as a simple clock pulse if it is a user command, or as an input data and a clock pulse if it comes from internal circuitry, and restarting a new cycle from point a);

c) if step a) is positive, verifying whether the new command can be ignored or not; and d) if step c) is negative, storing the command in the buffer, waiting for the state machine to end execution of the previous command, conveying the stored command to the state machine in the form of input data and of a clock pulse, then erasing the command from the buffer and restarting a new cycle from step a).

By analogy, the arbitration structure is like an efficient secretary capable of accepting the tasks and of communicating them to the employee only if necessary and if this person is not at the moment busy with other tasks. In this manner, it is possible to reduce the stress and to improve the quality of the work of the employee. In comparison, the error probability of the device in accordance with the invention is drastically reduced by realizing an accurate state machine (employee) and an efficient arbitration structure (secretary).

Such a difference between a prior art interface and an interface of the invention may be pictorially highlighted as respectively provided in FIGS. 1a and 1b. FIG. 1a is suggestive of the relative complexity of a traditional design. FIG. 1b is suggestive of the relative simplicity of a design according to the invention based on the implementation of an arbitration circuit of the input signals.

DETAILED DESCRIPTION OF THE PREFERRED EMBODIMENTS

Having established the architectural approach of the invention, it is possible to describe in more detail how to design a proper input arbitration structure (ARBITRO). Since the invention is applicable and effective in many different cases, the following description will not refer to a particular specification, but rather an effective design approach for the different arbitration circuits specific for the different possible commands, which will be identified and illustrated below.

Basically, according to the present invention, the input arbitration structure manages the following situations that may be classified into the following groups:

GROUP 1—External (user) commands while an evaluation is not in progress;

GROUP 2—Internal commands while an evaluation is not in progress;

GROUP 3—Internal or external commands while an evaluation that cannot be neglected for supporting the specification is in progress; and GROUP 4—Internal or external commands while an evaluation that can be neglected is in progress because it would not change the state of the state machine.

In the above situations, the arbitration structure must perform as follows. GROUP 1—Masking eventual further commands to the SM for a time Teval sufficient to carry out the evaluation; and transmitting the clock edge in the form of a monostable signal to the SM. GROUP 2—Masking eventual further commands to the SM for a time Teval sufficient to carry out the evaluation; providing the information in input to the SM in a real time fashion; and issuing a clock pulse to the SM after a certain time interval Tsu. GROUP 3—Storing the request in a real time fashion; waiting for the end of the operation in progress; providing the stored information (that can be defined as INTDATA) to the SM; issuing a clock pulse to the SM after a certain time interval Tsu; and resetting the buffer storing the already used information. GROUP 4—Ignoring the request and doing nothing.

Figure 1A:
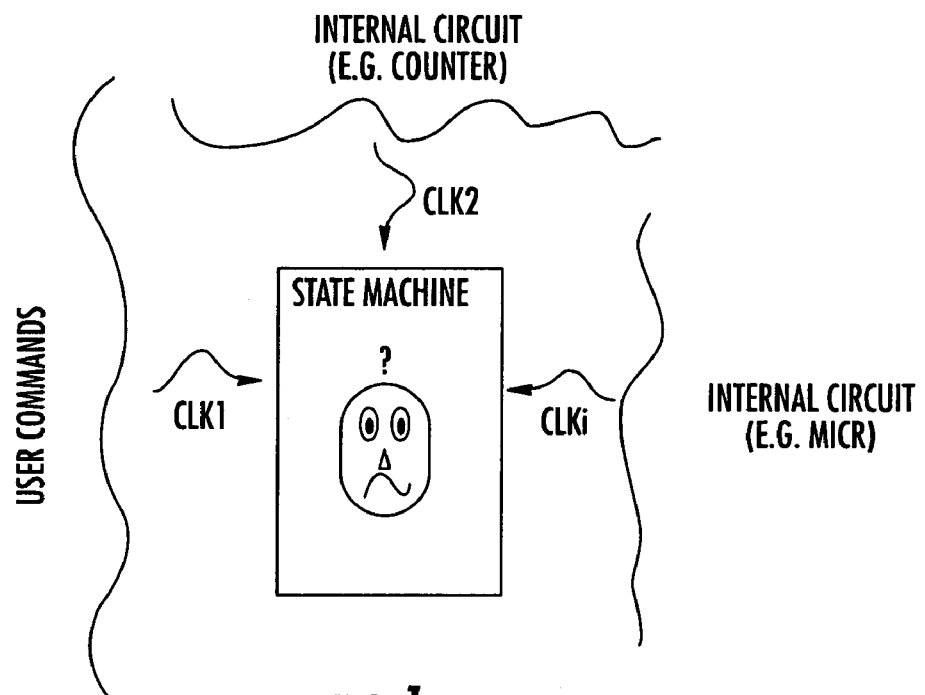
FIG. 1a is a representation that illustrates the functioning of a finite state machine interface in accordance with the prior art.
Figure 1B:
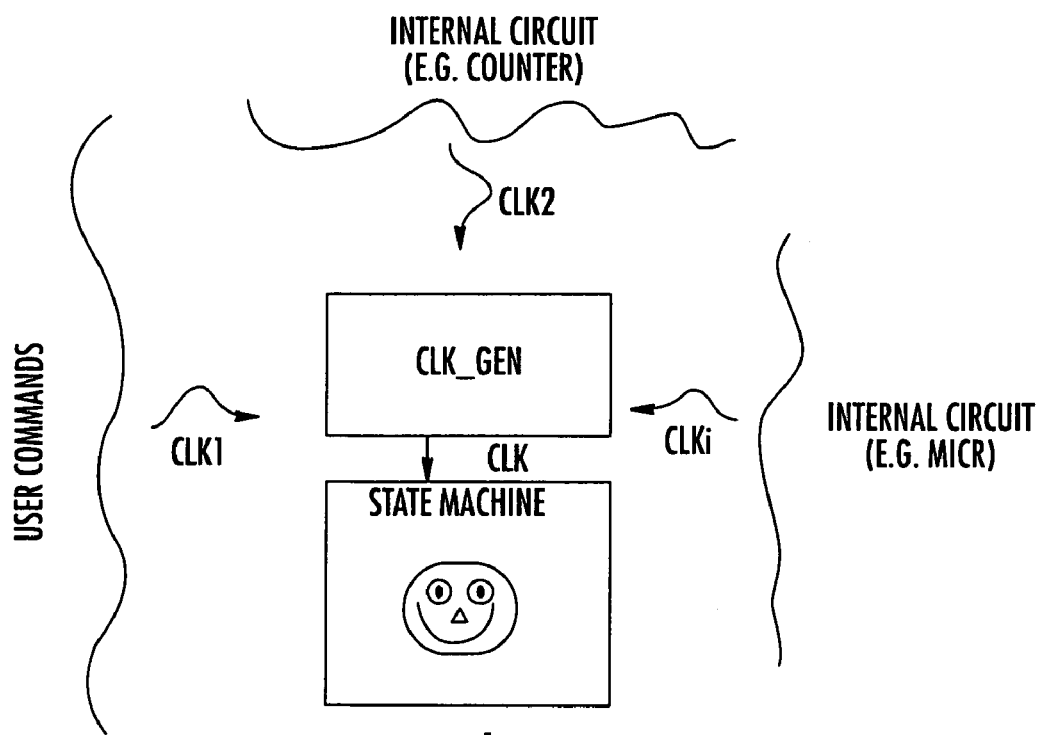
FIG. 1b is a representation that compares the functioning of a finite state machine interface in accordance with the present invention.
Figure 2:
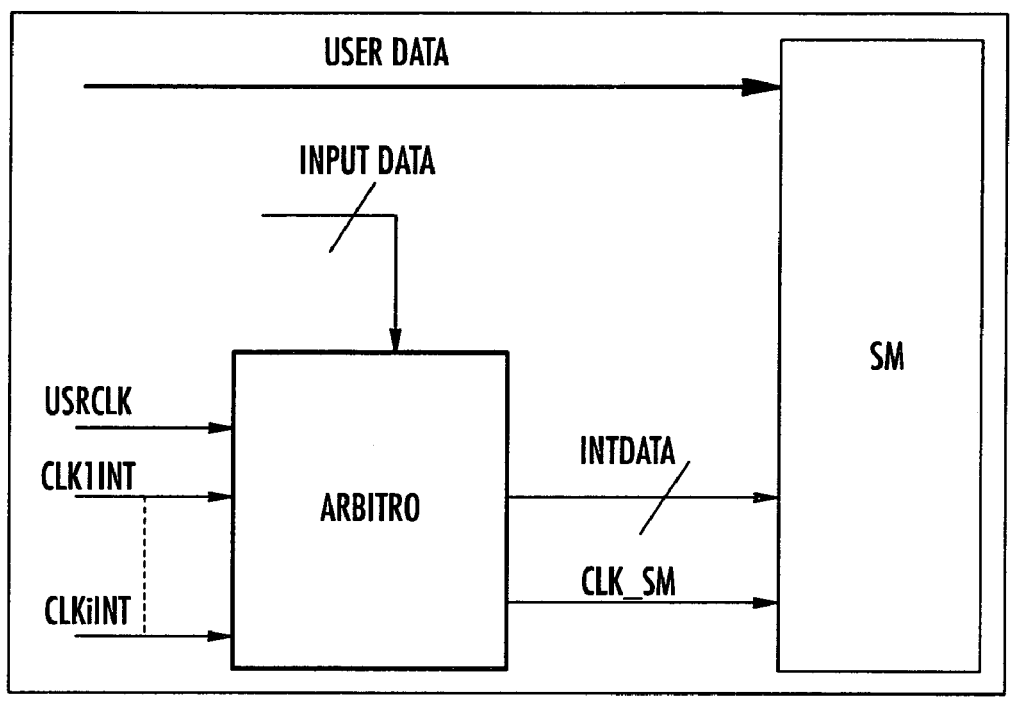
FIG. 2 is a high level block diagram of the architecture of the interface in accordance with the present invention.

FIG. 2 is an interface architecture scheme of the invention, characterized by the presence of an arbitration structure ARBITRO. The inputs and the outputs toward the finite state machine SM are provided with appropriate labels identifying the distinct input signal paths. Among the various ways of embodying this architectural approach based upon the specifications and the preferences of the designer, a possible configuration that may be easily adapted to any specific case will be presented below.

Figure 3:
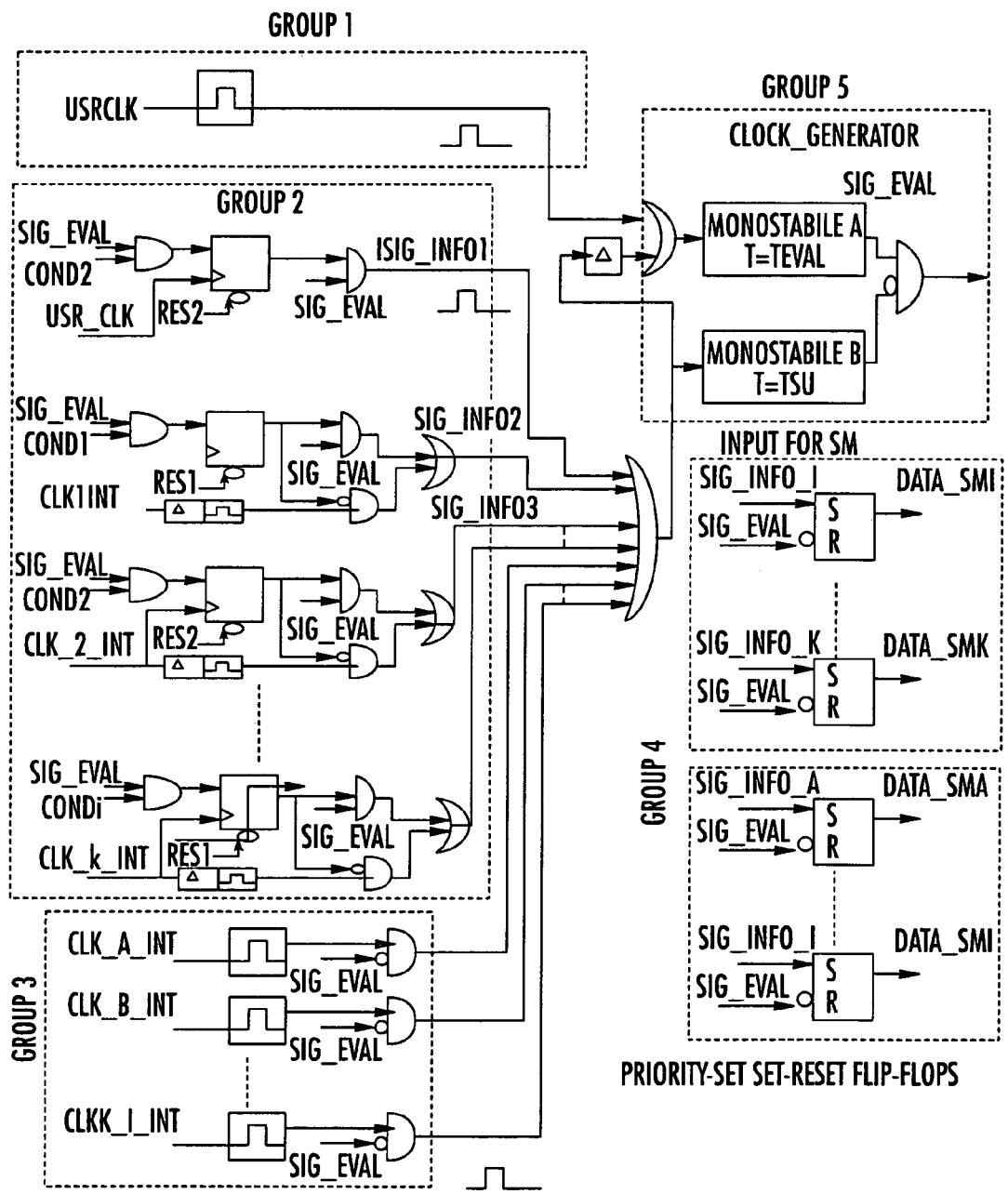
FIG. 3 is a basic circuit diagram according to one embodiment of the input arbitration structure in accordance with the present invention.

FIG. 3 depicts a possible circuit for the structure ARBITRO of the interface of the invention illustrated in FIG. 2. The different conditioned paths of commands may be recognized by looking at the respective zones contoured by a dotted and dashed perimeter in the general circuit diagram of FIG. 3.

The zone of FIG. 3 labeled GROUP 1 relates to the signal path stimulated by user commands arriving while the state machine is not carrying out any evaluation. In contrast, when an evaluation is still in progress, such a path is disabled by the gate input with the signal Teval (see the block CLOCK GENERATOR).

The zone of FIG. 3 labeled GROUP 3 relates to the signal path stimulated by commands coming from the internal circuitry while the SM is not carrying out any evaluation. The zone of FIG. 3 labeled GROUP 2 relates to the signal path through which commands (user and other commands) arriving during evaluation of a previous command are stored. The signals Cond_i represent the conditions (determined by the internal state of the SM) that determine the temporary storage and the eventual successive delayed evaluation only if necessary.

The zone of FIG. 3 labeled GROUP 4 relates to the signal path stimulated when suitable input signals must be provided to the SM because internal or delayed commands have been received. The zone of FIG. 3 labeled GROUP 5 relates to the circuit that generates the clock and the signal Teval to be sent to the SM.

Figure 4:
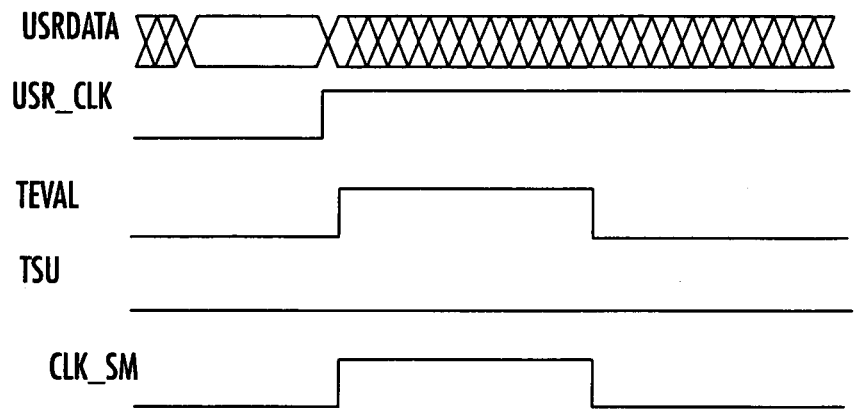
FIG. 4 is a timing diagram for the structure of FIG. 3 relating to a first group or category as defined in the application.

Referring to the timing diagram depicted in FIG. 4, in case of a GROUP 1 command, a start pulse is provided to the monostable A that generates the signal Sig_eval having a duration equal to Teval that is long enough to carry out the evaluation. Evaluation refers to the propagation time through the registers of the SM plus the time needed by the input logic network to stabilize itself following a change of the state variables. In fact, it must be considered that just after the time Teval has elapsed, a new evaluation may take place. The monostable signal shown in the lowest part of FIG. 4 cannot be set for the whole Teval interval because all the paths that could set it are disabled during this time interval. The CLK_SM is the Sig_eval, thus the timing of the SM is similar to that illustrated in the diagrams of FIG. 4.

As may be easily noticed, nothing changes and the set up times of data, ensured by the user with respect to USRCLK, are guaranteed even with respect to CLK_SM. As long as MON_A does not return in stand-by, any new clock pulse will be transmitted in real time.

Figure 5:
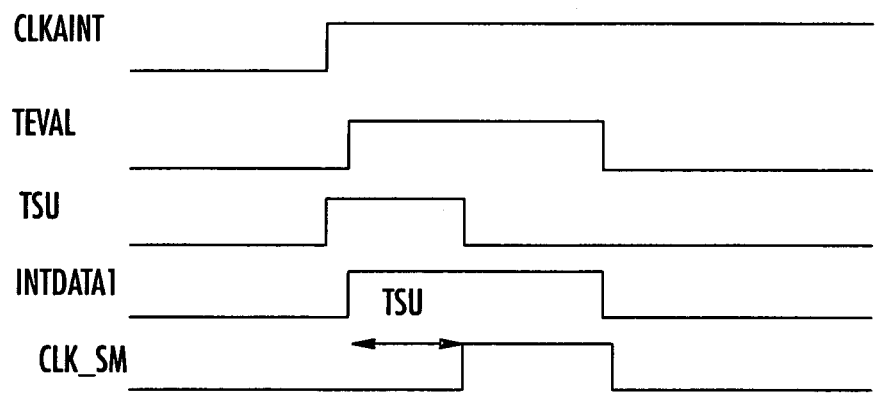
FIG. 5 is a timing diagram for the structure of FIG. 3 relating to a second group or category as defined in the application.

In case of a GROUP 2 command, an internal command arrives while no operation is in progress. In this case, the timing will be that depicted in FIG. 5, wherein the signal CLKAINT represents a generic internally generated evaluation request reaching the SM.

The two monostable pulses are generated in real time. As a matter of fact, MON_B switches MON_A in order to avoid any glitches on the clock. The monostable pulse MON_A blocks any eventual interfering command towards the SM. The monostable pulse MON_B times the SM input data with respect to the clock pulses.

The signal INTDATA, which represents the information, is instantaneously set. After a time Tsu, determined by the monostable pulse MON_B, a clock pulse may be issued. In this case, the timing of the signal CLK_SM is determined by the difference (Teval-Tsu). Therefore, this difference must be greater than the evaluation time plus the stabilization time of the input logic network of the SM following variations of the state variables.

Figure 6:
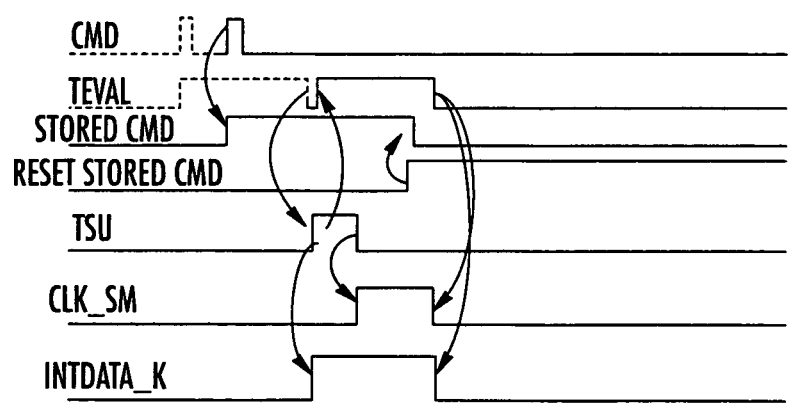
FIG. 6 is a timing diagram for the structure of FIG. 3 relating to a third group or category as defined in the application.

In the case of a GROUP 3 command, a user command or an internal command that cannot be neglected is received while an evaluation is still in progress. The information (command) is stored in memory elements (flip-flops), and only when the interval Teval of the operation in progress expires. The new evaluation may be started with the same execution characteristics of a GROUP 2 command. FIG. 6 depicts the timing diagram relative to this third group.

Figure 7:
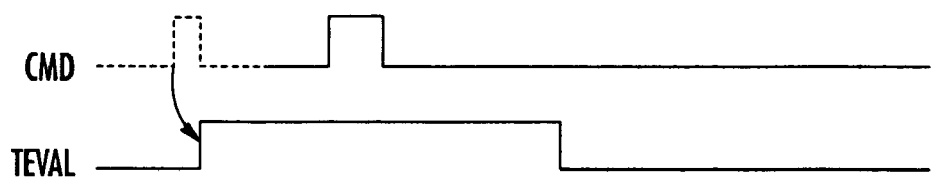
FIG. 7 is a timing diagram for the structure of FIG. 3 relating to a fourth group or category as defined in the application.

FIG. 7 depicts a possible timing diagram of an external (user) command or request for evaluation or a GROUP 4 internal command. As highlighted by the diagram of FIG. 7, any request that is not to be stored in a memory element and that arrives while an evaluation is still in progress is masked by SIG_EVAL and is never executed.

The circuit depicted in FIG. 3 is just a sample embodiment. An arbitration structure ARBITRO with the above illustrated functions may be realized using circuits that may be adapted or optimized depending on specifications and preferences of the designer.

The architecture of the invention has many advantages. An interface made according to this invention does not have windows that are not sensitive to commands as wide as a classic structure normally has because of the fact that a local reset pulse of finite duration masks eventual user commands. According to the novel approach of this invention, the reset signal of the SM is the same global reset signal of the whole logic circuit and does not switch during normal functioning. The window of indetermination of a structure realized according to the present invention is smaller than the crossing time of just a couple of fast logic gates (i.e., a fraction of a nanosecond).

The complexity of the design is significantly reduced because it is possible to design a SM through a standard description with a single clock and a single reset such to make any transition easily predictable. Moreover, the arbitration structure ARBITRO may have, in general, a modular structure whereby it is always possible to make a new situation fit one of the four groups described above so that the circuit module for managing remains standardized.

A consequence of these peculiarities and advantages is that the structure may be reproduced in different technologies and may be quickly adapted to changes in the specifications. It is thus possible to save a lot of time in designing and in re-designing.

Another advantage that may be underlined is the reduced silicon area requirement for realizing the SM. In fact, as stated before, the possibility of describing the SM in a standard fashion allows for an optimized codification of all the states, and thus it is possible to reduce the number of bistable state circuits required.

A consequence of this is simplification in the testability of the interface. In fact, the variables that describe completely the state of the machine are less numerous, therefore more readily encoded and localizable on a single bus. It is thus easier to bring out (access) the variables to test the SM. It is even possible to force the starting state, issue a clock pulse and read the final state.

Use of the interface as a clock arbitration structure for the command interpreter of a FLASH memory will now be discussed. According to the most recent developments, so called FLASH-EEPROM non-volatile memory devices can manage, by their own internal logic circuitry, complex updating algorithms and generate autonomously the relatively high voltages that are needed for erasing and writing data.

In order to make it possible, specific digital structures are needed, among which a microcontroller that, depending on the task to be performed, carries out an appropriate sequence of operations or steps (algorithm). A counter is needed for managing, among other things, the timing of the application of high voltages to specific circuit nodes.

In certain FLASH memories there are specific logic circuits for managing the protection and for managing other functions. Among the digital structures there is also an interface structure, commonly known as a command interpreter (CI) that, depending on complex specifications, recognizes (by way of codes) the operations that the user requires, and establishes a handshake with pertinent digital circuits. For example, according to certain specifications, once the sequence of commands corresponding to an erasing operation has been detected, the CI starts a counter, waits for a signal TIMEOUT and communicates to the microcontroller a state of readiness to run the relative code. The communication ends with the end of the operation, signaled by the microcontroller to the command interpreter.

Obviously, among different specifications there are differences in the codes used for a certain operation as well as in the type of operations that are contemplated. For example, certain specifications contemplate a suspension of the programming, and in other specifications such a command is not accepted. Generally, these differences do not imply any substantial difference in the design of the command interpreter. Instead, a decoder is realized to recognize certain codes instead of others and a state machine (SM), wherein certain states and certain transitions are contemplated as needed.

There is a crucial difference that distinguishes the specifications in the two categories. Each imposes implementation of a state machine conceptually different from the other, with the associated risk of introducing errors in designing a memory device compatible to both categories of specifications.

For the sake of simplicity, a first category may be represented by INTEL specifications, and the other category by AMD specifications. The substantial difference between the two types of specifications may be highlighted with an example. In memory devices of the first kind (INTEL), when an operation ends, for example, a program operation, the CI must not react by changing its state immediately, but it will do so only after a user command is received that makes the SM return to its initial state. In memory devices of the second kind (AMD), in the same situation, the CI must change its state by returning to an IDLE state without any user command. Indeed, when the operation ends, a new sequence of commands may start immediately that must be accepted.

In order to understand why this difference is rather substantial, it must be observed that in the first case there is only a source of commands, and other circuits may condition the successive evaluation but cannot determine it. In the second case, on the contrary, more than one source may start the evaluation or change directly the state of the SM.

What complicated the situation is that there is not and could hardly-exist any synchronization among user commands and commands coming from internal circuits. This implies that, while a certain evaluation is being carried out, a successive command may arrive that should not change the evaluation in progress, but is not to be omitted.

There is a certain number of operations that are managed by the user without any handshake with a microcontroller or with a counter. Such operations are CFI, AUTOSELECT, and UNLOCK_BYPASS that are not analyzed in detail because they do not require any adaptation of the arbitration structure according to the present invention.

A command PROGRAM relates to a programming operation of a word at a certain memory address. In this case, the beginning of the operation is determined by the user. During the programming, before the microcontroller signals the end of the operation by the signal ENDOP, no user command may cause a change of state. Software reset (reset sw) and suspension commands are not admitted. When ENDOP is received, there are two possibilities. If the algorithm was successfully concluded, the SM must return to an IDLE condition, ready to start another operation. On the contrary, if the algorithm failed, the SM remains locked as long as the user, having detected the fail, gives the F0 (reset sw) command to unlock it. Therefore, in one case it is the microcontroller that unlocks it, and in the other case, it is the user who does it.

Another possible operation is CHIPERASE that includes canceling all memory sectors of the FLASH_EEPROM device. The managing, from the point of view of the command interpreter, is the same as for the command PROGRAM. Another allowed operation is BLOCKERASE that includes canceling one or more memory sectors chosen by the user. It is more complex because of the various possibilities that are contemplated by the specification.

After a pre-defined number of user commands, the user signals the address of a sector to be erased. If there is not any further intervention by the user, after a certain pre-established time (50 µs), the algorithm erases the selected sector. On the contrary, if the user indicates a different sector to be erased before 50 µs are elapsed, the counter restarts counting 50 µs, and so on for as many sectors the user wants to select. After 50 µs are elapsed from the last indication of a sector, the algorithm carries out the erasing. When the algorithm ends there are the two possibilities already described for the other operations of data modification. A substantial difference with respect to the other operations of modification includes a suspension, ordered by the user, which is acceptable while waiting for a TIMEOUT (thus, the algorithm has not been started yet), as well as while the algorithm is in progress.

This spectrum of possibilities highlights the different interleaving that may occur among different asynchronous commands. For example, if a SUSPEND is received immediately after a TIMEOUT, it must be ensured that the first command is not lost because the user expects a suspension after that command.

There are various known circuits that implement a command interpreter referred to AMD type specifications. To illustrate in detail these techniques may be burdensome, but in these known circuits the managing of the multiple asynchronous commands is implemented in a structure having a core SM (finite state machine) around a plurality of memory devices (each of which may work with its own clock and with a different reset condition) that condition the clock and the reset of the core SM. Moreover, many of these synchronous elements determine a chain of reactions such that the setting of a flip-flop may cause the generation of a reset pulse that resets another flip-flop, which in turn resets the first flip-flop.

For instance, given a sequence of user commands that, when detected, implies an operation of data modification (program or erase). Let us suppose that at the time T0 an evaluation of a user command is in progress. If at the time T0 an ENDOP coming from the microcontroller is received, this command could be lost or change the state of the CI while it is already evolving. In certain known approaches, ENDOP acts on the reset of the core SM, and thus it is able to bring the SM to an IDLE state irrespectively of the evaluation that was in progress.

This effect must be masked though if the ENDOP arrives when a failure of the algorithm has already occurred, and thus an appropriate conditioning must be implemented. Even more articulated is the managing of a possible proximity between TIMEOUT of the counter, and a suspension required by the user.

Depending on the adopted approaches, there is the risk of losing the suspension, and this is not allowed by the specifications. Beyond practical examples, it is easy to recognize the risk that hides in any design approach that cannot rely on a rigorous structure of the specifications, but on establishing an appropriate control for each situation. This implies a variety of actions, such as to the masking of the clock, such as to the conditioning of the reset and other times to a mix of actions.

The most evident drawbacks are as follows.

WIDE WINDOWS THAT ARE NOT SENSITIVITE TO COMMANDS. If in certain situations an operation is carried out changing the state by a reset pulse of a non-null duration while in other situations by a clock edge, it easy to understand that there may be wide windows that are not sensitive. In fact, in a bistable state circuits, as long as a reset pulse is active an eventual clock pulse that may arrive will not change its state. Moreover, if a clock pulse is very close to the reset, the state assumed by the memory element could be random.

POSSIBILITY OF HALT. The considerations made above imply that an ENDOP type command could be lost. This command arrives only once and if lost, the system could halt in the modification state or even in an unforeseeable state. The problem is aggravated by the fact that in certain conditions a software reset command contemplated by the FLASH memory must be ignored.

AREA OCCUPATION. The designer has a limited possibility of optimizing area occupation because he must consider all possible conditions using an approach that hardly leads to a standard SM definition. There are several memory elements with control pins conditioned in the most various manners, and therefore, they are difficult to be simplified even by an automatic optimization tool.

DIFFICULT TESTABILITY. The state in which the IC is at a given instant is determined by all the bistable state circuits that have been used, which are numerous and not commonly disposed. Therefore, it is difficult to couple them to a few output pins, as it happens in a test mode. Moreover, it is excessively laborious to make tests in which it is possible to force any initial condition and detect the future state to ascertain the correct functioning of the system.

DIFFICULT REPRODUCIBILITY. Having the design follow the approach of satisfying each point of the specification, it is hard to quickly adapt the same circuit to a different specification, even if only slightly different from the original one.

It is useful to remark that, in applications that use flash memory devices, the probability of a multiple demands to the SM coming from different sources is rather small. This is because the user provides commands that are properly spaced according to the specification. The microcontroller intervenes with a single signal ENDOP to signal the end of an operation, but does it only once per operation and executes operations that last relatively long (several μs for programming, and seconds for erasing). The counter generates a single TIMEOUT for each sector cancellation operation and provides it after 50 μs from the provision of the address of the last sector to be canceled. This explains why approaches that are not so rigorous from the point of view of the design approach seldom show malfunctions.

Besides, once the circuit has been formed on silicon, if a malfunction occurs it may be difficult to attribute it to the CI because such a situation cannot be reproduced. Since a low probability does not mean that it cannot happen, it is very important to minimize the risk of possible failures by defining a CI structure that does not have the above mentioned criticalities and drawbacks of the known CI structures that are used in these types of memory devices.

The interface architecture of the present invention eliminates or reduces in an extremely effective manner the above mentioned problems. In fact, the above discussed problems pertain to a digital structure with multiple clocks and multiple resets. According to the approach of the present invention, the design of the CI structure is split in the design of a distinct command arbitration structure (clock and data arbitration structure, in the case considered) and of a state machine functioning with a single clock and a single reset.

The objective is thus to design an input arbitration structure that receives multiple clocks and multiple resets and communicates with a conventional SM using a single clock and a single reset. The input arbitration circuit (ARBITRO) performs the following functions: provides a single clock (CLK); provides supplementary input data to the SM with appropriate set up and hold; and separates the evaluation operations in order to carry them out one at the time.

For the particular application being considered, the possibilities are the following: user commands while the SM is not evaluating; an end count command from the counter (TIMEOUT) while the SM is not evaluating; a command from the microcontroller (e.g., ENDOP) while the SM is not evaluating; a command from the microcontroller while the SM is evaluating; a user suspension command (SUSPEND) while a previous counter command is being executed; any user command, except a SUSPEND, while an evaluation is in progress; and a command from the counter while an evaluation is in progress.

The arbitration circuit (ARBITRO) operates in one of the three following ways: 1) accepting the command and passing it to the SM because it is not engaged in any task; 2) accepting commands but passing them to the SM later if the SM is engaged in an evaluation; and 3) ignoring the commands because the specification allows it.

Moreover, there are user commands that may be issued while the SM is free but may not be carried out because it is not allowed by the specification. For instance, if the SM is in a state BLOCKERASE (cancellation of one or more sectors), the only user command that may cause a change of state (before the end of the operation decided by the microcontroller) corresponds to the suspension code. Any other user command must not change the state of the machine. It is then possible to decide in this case to not produce a useless evaluation.

In such a case, which is an important application of the invention, the operations to be carried out are as follows:

GROUP A1: masking other possible commands for a time Teval; and providing a clock pulse to the SM in a real time mode.

GROUP A2: masking other possible commands for a time Teval; providing the input data to the SM in a real time mode; and providing a clock pulse to the SM after a time Tsu.

GROUP B: storing the request in a real time mode; waiting for the end of the operation in progress; providing the input data to the SM in a real time mode; and providing a clock pulse to the SM after a time Tsu.

GROUP C: ignoring the command and doing nothing.

Figure 8:
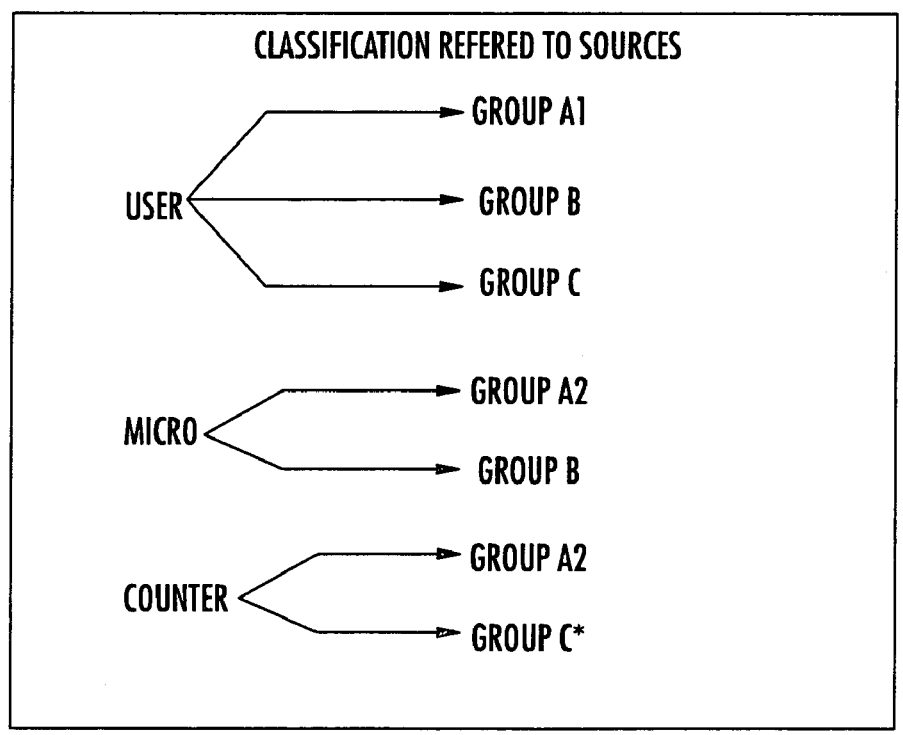
FIG. 8 is a classification table of commands relating to a specific application of the architecture of the invention for a FLASH AMD-compatible memory.
Figure 9:
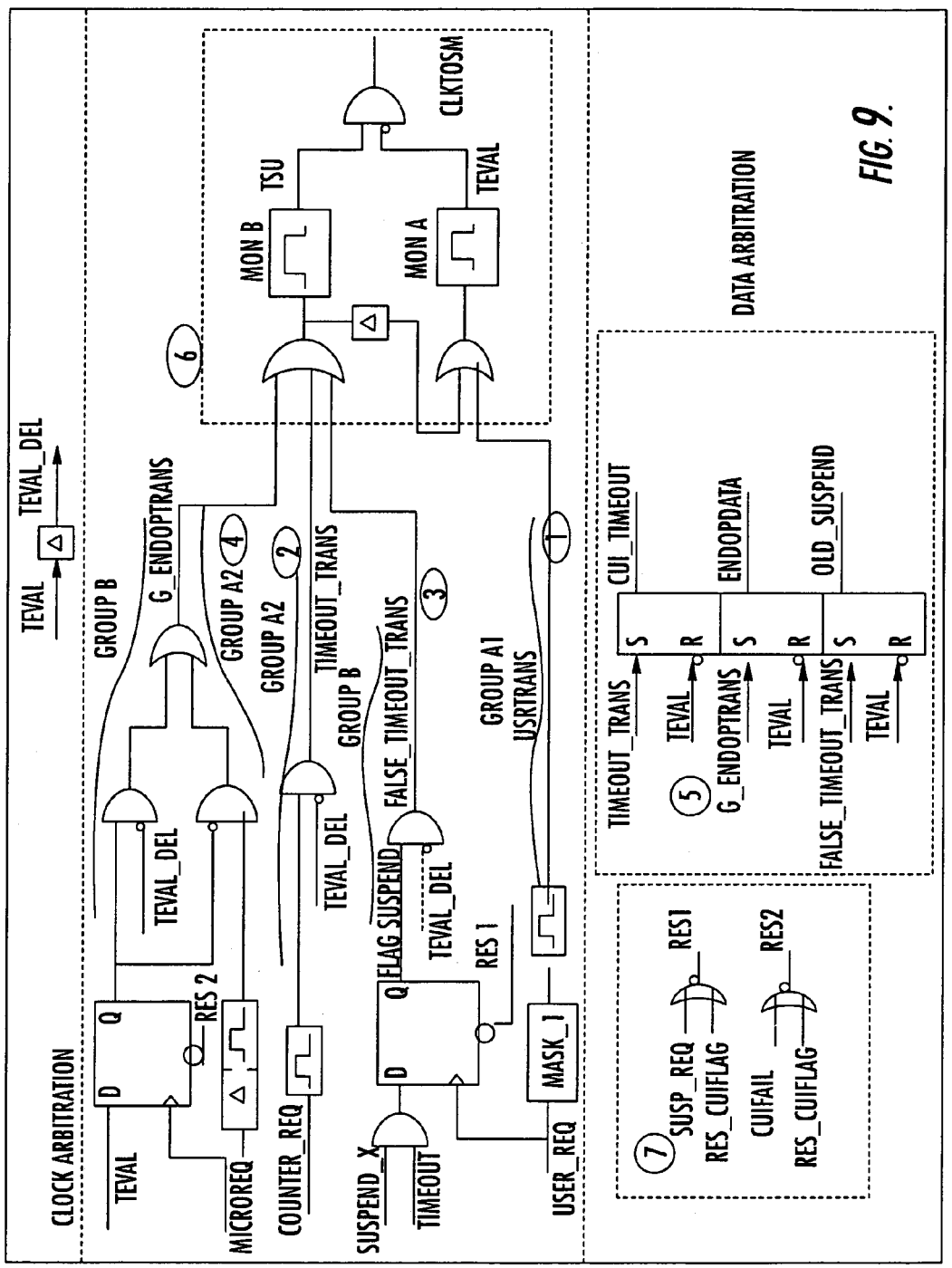
FIG. 9 depicts one embodiment of an arbitration structure of a command interpreter for a FLASH AMD-compatible memory in accordance with the present invention.
Figure 10:
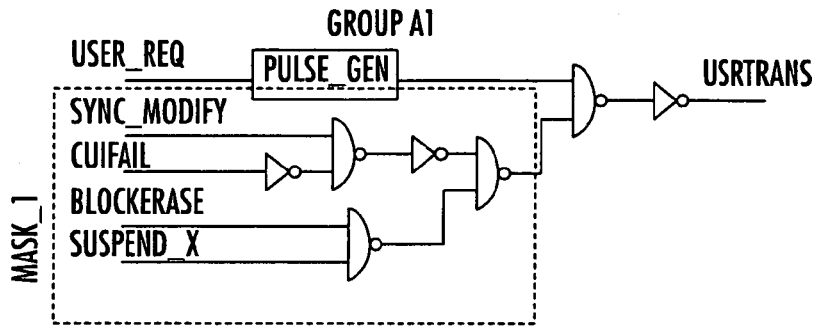
FIG. 10 illustrates the path of commands coming from the user in the case of a FLASH AMD-compatible memory in accordance with the present invention.

The above classification, when referenced to their sources, may be represented as shown in FIG. 8. A possible embodiment of an arbitration circuit for the type of application of the interface of the invention, i.e., as an arbitration structure for input clock signals, is depicted in FIG. 9. The labeled portions of the circuit are separately analyzed in detail. The path of user commands relating to the situations of GROUPS A1 and C is that of FIG. 10.

CWE_N is the user clock that, when a command is produced, switches high. PULSE_GEN transforms a rising transition in a pulse having a short duration that varies with temperature and the supply voltage. The duration of such a pulse does not have to be particularly precise. If the signal MASK_N is high, that is, the command is not masked, the result is a simple pulse on the signal USRTRANS. The portion of the circuit bordered by a dashed line that produces the signal MASK_N may even be omitted depending on what is contemplated in the design of the SM. Preferably, this portion of the circuit is present because it is safer to filter the request than making an evaluation that leaves the state of the SM unchanged (as any other command while a programming is in progress).

Therefore, the mask does not let user commands pass in all modification states while an algorithm is in progress, except in case of a suspension during the BLOCKERASE operation. If the algorithm has terminated and a FAIL has been generated, user commands must pass because an F0 is necessary to unlock the SM.

Figure 11:
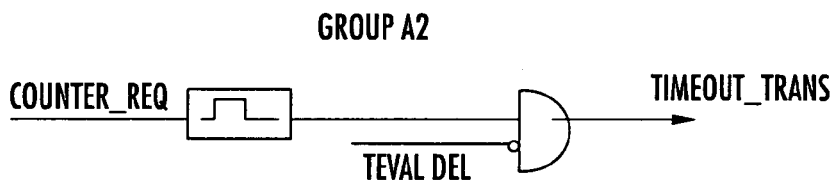
FIG. 11 illustrates the path of the command TIMEOUT coming from the counter of the FLASH AMD-compatible memory in accordance with the present invention.

CUIFAIL is the output signal of the SM that is set only when the algorithm ends in an unsuccessful manner. The signal SUSPEND_X is generated by a decoder that recognizes the code of the suspension command on the data bus. Given that the user must provide codes with an advance time Tsu before the clock pulse, the mask is in steady conditions when the front edge of CWE_N is received. The path for the command TIMEOUT generated by the counter that signals the end of the waiting to start the BLOCKERASE algorithm is highlighted in FIG. 11.

If any evaluation is in progress, there is a pulse on TIMEOUT_TRANS. If an evaluation has been started or if an evaluation is still in progress, such a pulse does not pass on TIMEOUT_TRANS. This is allowed by the specifications, because having an evaluation in progress when TIMEOUT is received means that the user has given a command. In fact, the microcontroller cannot be the cause of the evaluation because in this phase any modification has not been started yet.

Figure 12:
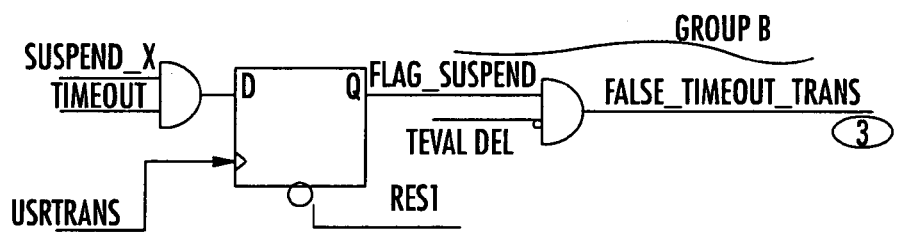
FIG. 12 illustrates the path of the user command SUSPEND during execution of a TIMEOUT command in accordance with the present invention.

From the specifications, a command may be a suspension, and in this case the TIMEOUT must not be delayed any longer, or a new sector is to be canceled. In this case, the counting must be reset and thus it is correct to lose the TIMEOUT that could be received in this phase, or any other command must return the SM in IDLE state. Therefore, even in this case, the TIMEOUT is ignored. The path that ensures that the user command SUSPEND is not lost during the execution of the TIMEOUT is highlighted in FIG. 12. The specification does not allow such a loss of information that must be stored and carried out later (GROUP B). Therefore, a memory device is necessary.

If a leading edge of USRTRANS is received and the function on the data present at the input D of the flip-flop confirms that an evaluation, caused by the counter because of the end of the counting, is going to be started (TIMEOUT) or is already in progress, and the user has imposed the code SUSPEND on the data, the FLAG_SUSPEND is set. This information cannot pass as long as the evaluation is in progress (Teval has not yet elapsed). At this point FALSE_TIMEOUT_TRANS switches high and this, as is better described below, will eventually start the new evaluation.

As soon as such an evaluation starts, the switching of Teval quickly switches S1 low. In cascade to the output FALSE-TIMEOUT-TRANS may be present in a stretcher circuit that stretches the pulse, in the sense that it leaves unchanged the leading edge and delays the trailing edge. This better ensures the propagation of information.

Figure 13:
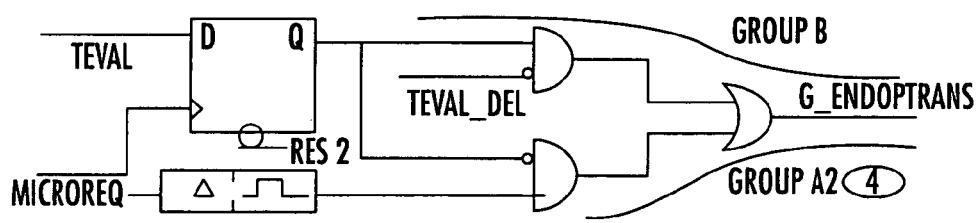
FIG. 13 illustrates the path of an ENDOP command coming from the microcontroller of the FLASH AMD-compatible memory in accordance with the present invention.

The path for end operation commands coming from the microcontroller, when the SM is not evaluating and when the SM is evaluating, is highlighted in FIG. 13. When there is a command coming from the microcontroller, there cannot be situations belonging to GROUP C and thus the command cannot be ignored.

When a trailing edge of ENDOP_N is detected, if USRTRANS has not been started yet or an evaluation Teval is in progress, a pulse will pass through the lower path on G_ENDOPTRANS. On the contrary, when ENDOP_N arrives, the lower path is blocked by the setting of the flip-flop. The information carried by ENDOP cannot be evaluated immediately, and for this reason it is blocked by Teval. Only at the end of the evaluation in progress will the stored evaluation will be started. Even in this case, a pulse stretcher stage may be present. The information of the flip-flop is reset (RES2) only when the deferred evaluation has brought the SM in the correct state.

The circuit structures described so far represent the possible paths leading to the generation of pulses on one of the four intermediate signal paths that, in some way, must determine the generation of output signals from the arbitration structure ARBITRO. The remaining portions of the arbitration structure, respectively establish the clock and the supplementary input signals, to be provided to the SM to enable it carry out the required evaluation.

Figure 14:
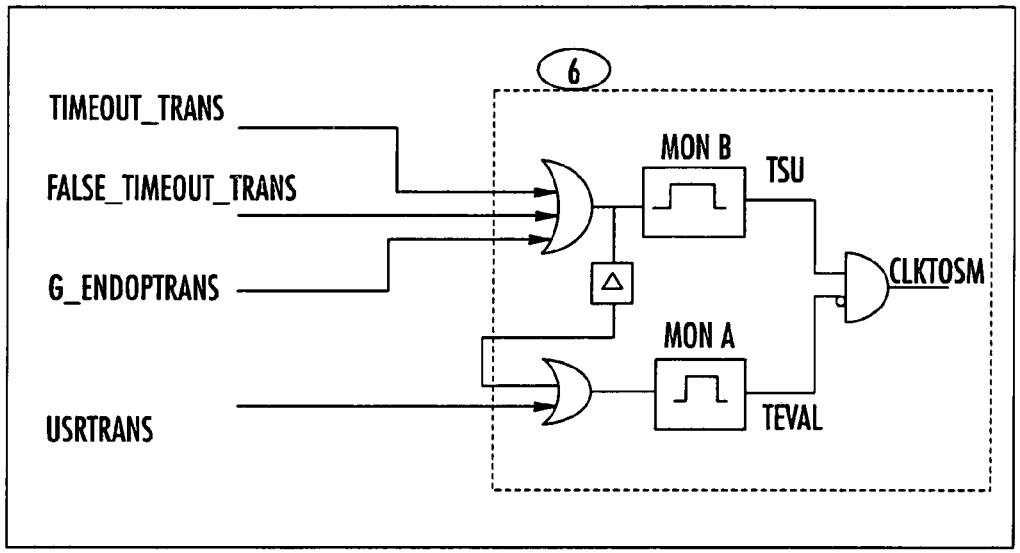
FIG. 14 depicts a significant portion of the circuit for generating the clock to be fed to the state machine in accordance with the present invention.
Figure 15:
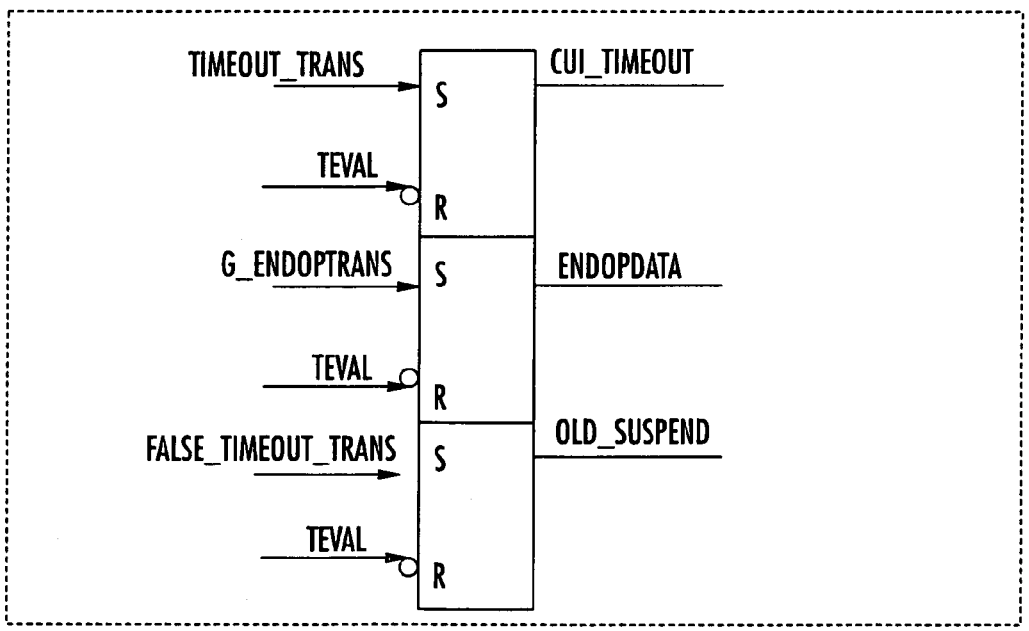
FIG. 15 depicts the functional diagram of a priority-set, set-reset flip-flop for managing the additional data to be sent to the state machine in accordance with the present invention.

By referring to FIG. 14, the function that determines the clock CLOCK_TO_SM that is sent to the timing input of the SM is the logic difference between the outputs of two monostable devices. The monostable MON_A has a time duration Toper that represents the time needed to completely carry out an operation. The monostable MON_B has a time duration defined by the fact that when it is necessary to provide inputs to the SM, they must be provided in advance of a set up time. The maximum set up times required by the fake inputs are established by the circuit of zone 5 of FIG. 9 and shown in FIG. 15, which are as follows: OLD_SUSPEND for an evaluation of deferred suspension; ENDOPDATA for an evaluation due to a command of the microcontroller; and CUI_TIMEOUT for an evaluation determined by the counter.

If the pulse is generated directly by the user (and not deferred), no further fake pulse is to be provided by the arbitration structure. In this case, the MON_B remains idle and the CLK_TO_SM will coincide with the pulse of MON_A. Because the output CLOCK has a minimum delay with respect to the user clock (CWE_N), the set up and hold times of the data provided by the user are practically unchanged with respect to the user clock.

Figure 16:
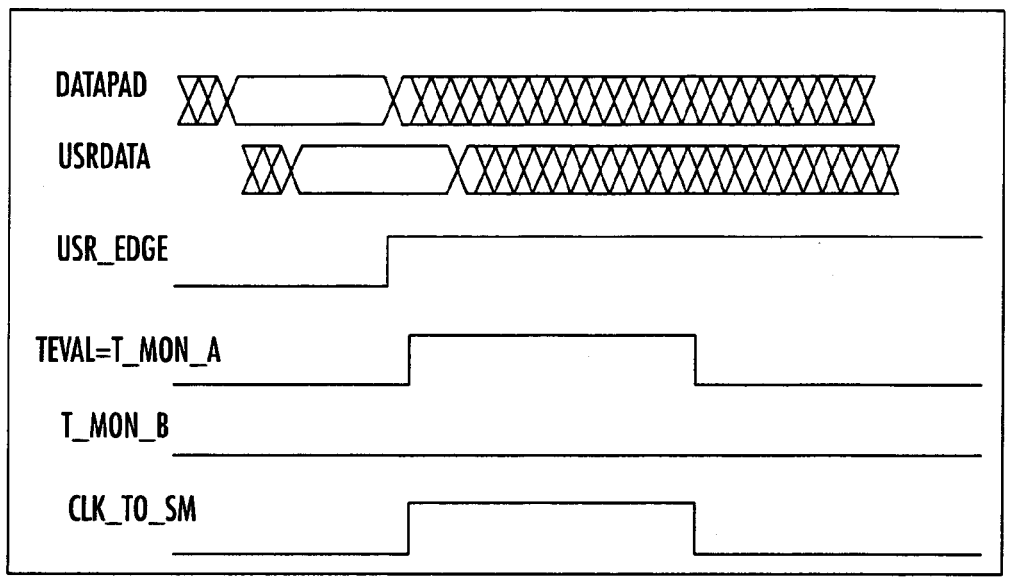
FIG. 16 is a timing diagram relating to real-time user commands of group A1 in accordance with the present invention.

FIG. 16 illustrates the timing for the case of real time user commands (GROUP A1). In each of the other three possibilities, the pulse shall determine the almost simultaneous switching of the two monostable devices and the CLK_TO_SM will be that depicted in the timing diagram of FIG. 17, delayed by T_MON_B, that is, by Tsu with respect to the leading edge of MON_A. By considering the fact that, together with MON_A, the fake input relative to the pulsed signal that starts the chain is set, it may be stated that Tsu is the time between the fake data and the leading edge of the clock. The small delay of FIGS. 9 and 14 ensures that MON_B starts just ahead of MON_A to prevent the generation of glitches on the clock.

Figure 17:
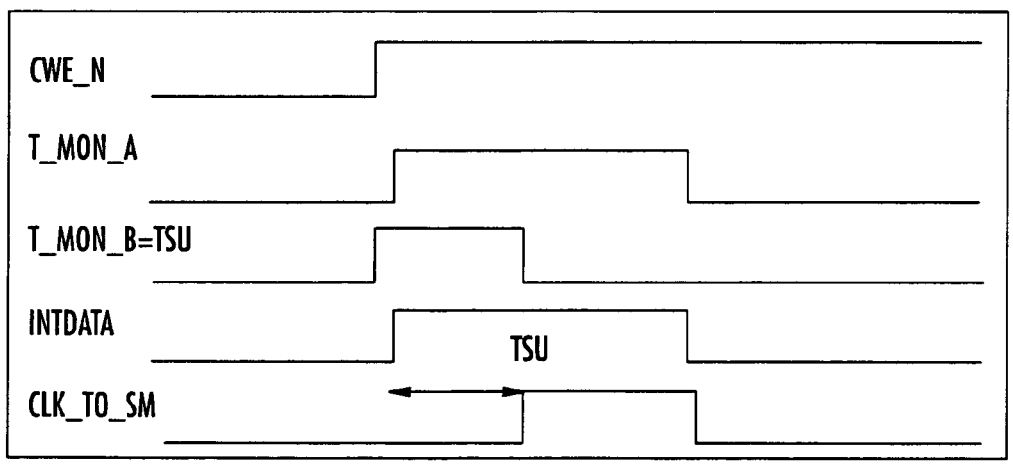
FIG. 17 is a timing diagram relating to internal commands (from a microcontroller, a counter, etc.) or to delayed commands in accordance with the present invention.

This situation is illustrated in the timing diagram of FIG. 17, wherein INTDATA must be associated, depending on the cause, to either ENDOPDATA, CUITIMEOUT or OLD_SUSPEND. Referring to the circuit of FIG. 13, there are set-reset bistable state circuits with priority sets wherein the signals are set with the same pulse that generates the clock, and reset by MASKSIG_N that signals the end of the timing.

Another observation relates to the resets of the two flip-flops for the cases belonging to GROUP B. Such resets are obtained by signals determined by the SM that are set only when the evaluation that has been stored is started.

For example, the signal RES_FLAG_ENDOP_N resets FLAG_ENDOP only when RES_CUIFLAG is set, which is a signal active in the IDLE or ERASESUSPEND state, or when CUIFAIL is set. When this last signal switches high, it means that a fail has occurred but also that a command coming from the microcontroller has been evaluated. In the same way, the signal RES_SUSP_FLAG_N is determined by a signal SUSP_REQ that the SM sets at the moment of the occurred suspension.

Furthermore, certain output signals of the SM are used in the arbitration circuit. These signals reset the bistable state circuits when an evaluation has been finished if they were set for the reasons explained in describing the circuit portions of FIGS. 12 and 13. For the bistable state circuits relating to the microcontroller commands, it may be reset if the system goes to the IDLE state (whereby the SM sets RES_CUIFLAG) or if a CUIFAIL is produced.

In the first case, the ENDOP is processed and, with no fail having been generated, the system returns to the IDLE state. In the second case, the command has been processed but, if a fail has been produced, ENDOP is set. The reset of the other bistable state circuits takes place either in the case the suspension is immediate because the BLOCKERASE algorithm has not yet been started (the SM sets RES_CUIFLAG), or in the case if the algorithm is in progress, the signal SUSP_REQ, that corresponds to an acknowledge of the microcontroller that will suspend the algorithm as soon as possible is produced.

The main advantage of the illustrated approach is that of allowing the realization of a SM with a single clock and a single reset from which all the positive effects derive. The conventional character of the structure implies an improved controllability of all the situations, and thus less design errors and bugs. It allows use of a standard SM structure depending on needs instead of a hybrid structure. Moreover, it brings about a reduction of the occupied area because any design synthesizer tool will be able to optimize a conventional SM.

A further advantage is the nullification, or at least a strong reduction, of situations in which indispensable commands may be lost, and in which it is possible to be halted in a state from which it is possible to exit only with a hardware reset.

As far as the test modes are concerned, if the complexity of the specifications implies a $2^N$ number of states in order to know exactly the instantaneous working condition of the command interpreter, it is sufficient to output N signals that are those on which are encoded all possible states. It is also possible to force, in a test mode, the state variables through N inputs and successively provide a clock pulse to switch to the future state. It is possible to verify the correctness of the evaluation by inputting through the dedicated pads the new state variables. In other words, the designer has the possibility of implementing, with low cost, good controllability and inspectability of the command interpreter.

Any flip-flop, except those of the SM and of the arbitration structure, will be present in the hierarchy of the command interpreter and will undergo controls or conditionings depending on particular situations. Despite the arbitration structure being formed for a particular specification, its organization is absolutely general. Therefore, it is always possible to re-adapt it to other situations in which multiple command sources are involved.

Figure 18:
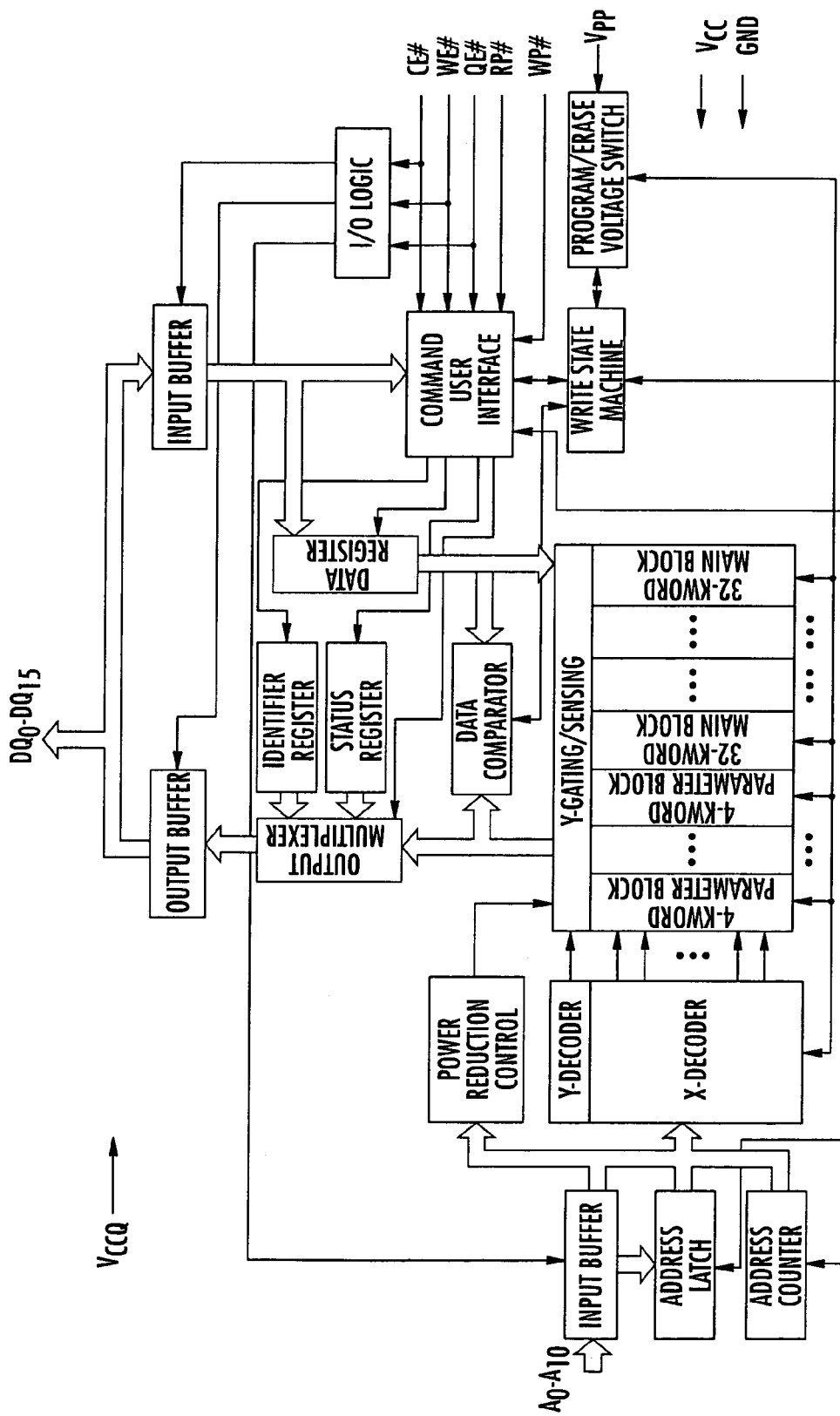
FIG. 18 is a high level block diagram of a commercially available FLASH-EEPROM device in accordance with the present invention.

FIG. 18 depicts a high level functional block diagram of a FLASH_EEPROM non-volatile memory device of the family of commercial devices 28F400B3, 28F800B3, called "SMART 3 ADVANCED BOOT BLOCK", produced by INTEL CORP. In the block diagram of the depicted device illustrating a typical, and under many aspects, an internal organization of a non-volatile memory device is provided. It is possible to recognize the functional block called COMMAND USER INTERFACE that is typically present in such non-volatile memory devices, even of others manufacturers.

A functional description of the whole non-volatile memory device may be found on the data sheet of the above-identified commercial devices and its reiteration does not seem necessary to understand the object of the present invention. The object of the present invention, as above discussed, relates to an improved architecture of the functional block COMMAND USER INTERFACE, or more briefly CI, as it is called in the present document. According to the present invention, the block COMMAND USER INTERFACE of a non-volatile memory device of a FLASH_EEPROM type has advantageously an architecture as that described herein and illustrated in FIGS. 9-17.

That which is claimed is:

1. An interface for a plurality of internal circuits and external circuits, the interface comprising:
   a finite state machine for managing asynchronous and independent interactions between the plurality of internal circuits and external circuits, said finite state machine functioning based upon a unique clock and a unique reset; and
   an arbitration circuit connected to said finite state machine for receiving input signals for said finite state machine, and for storing the input signals generated by the plurality of internal circuits when said finite state machine is performing an evaluation.

2. An interface according to claim 1, wherein said arbitration circuit provides the unique clock and the unique reset to said finite state machine.

3. An interface according to claim 1, wherein a clock for each internal circuit is different from the clocks of the other internal circuits.

4. An interface according to claim 1, wherein said arbitration circuit comprises a memory buffer for storing the input signals generated by the plurality of internal circuits.

5. An interface according to claim 1, wherein the input signals generated by the plurality of internal circuits comprise at least one of a command signal and data.

6. An interface according to claim 1, wherein said arbitration circuit comprises at least one of a plurality of logic and memory bistable circuits connected together for forming a plurality of distinct signal paths with the external circuits, and with the plurality of internal circuits.

7. A device comprising:
   a plurality of internal circuits; and
   an interface for said plurality of internal circuits and external circuits and comprising
      a finite state machine for managing asynchronous and independent interactions between said plurality of internal circuits and external circuits, said finite state machine functioning based upon a unique clock and a unique reset, and
      an arbitration circuit connected to said finite state machine for receiving input signals for said finite state machine, and for storing the input signals generated by said plurality of internal circuits when said finite state machine is performing an evaluation.

8. A device according to claim 7, wherein said arbitration circuit provides the unique clock and the unique reset to said finite state machine.

9. A device according to claim 7, wherein a clock for each internal circuit is different from the clocks of the other internal circuits.

10. A device according to claim 7, wherein said arbitration circuit comprises a memory buffer for storing the input signals generated by said plurality of internal circuits.

11. A device according to claim 7, wherein the input signals generated by said plurality of internal circuits comprise at least one of a command signal and data.

12. A device according to claim 7, wherein said arbitration circuit comprises at least one of a plurality of logic and memory bistable circuits connected together for forming a plurality of distinct signal paths with the external circuits, and with said plurality of internal circuits.

13. A non-volatile memory device comprising:
   a plurality of digital circuits; and
   a command interpreter circuit for recognizing operations required from the non-volatile memory device through command codes and for implementing a handshake with said plurality of digital circuits, said command interpreter circuit comprising
      a finite state machine for managing asynchronous and independent interactions between said plurality of digital circuits and external circuits, said finite state machine functioning based upon a unique clock and a unique reset, and an arbitration circuit connected to said finite state machine for receiving the command codes for said finite state machine, and for storing the command codes generated by said plurality of digital circuits when said finite state machine is performing an evaluation.

14. A non-volatile memory device according to claim 13, wherein said arbitration circuit provides the unique clock and the unique reset to said finite state machine.

15. A non-volatile memory device according to claim 13, wherein a clock for each digital circuit is different from the clocks of the other digital circuits.

16. A non-volatile memory device according to claim 13, wherein said arbitration circuit comprises a memory buffer for storing the command codes generated by said plurality of digital circuits.

17. A non-volatile memory device according to claim 13, wherein the command codes generated by said plurality of digital circuits comprise at least one of a command signal and data.

18. A non-volatile memory device according to claim 13, wherein said arbitration circuit comprises at least one of a plurality of logic and memory bistable circuits connected together for forming a plurality of distinct signal paths with the external circuits, and with said plurality of digital circuits.

19. A non-volatile memory device according to claim 13, wherein the said plurality of digital circuits and said command interpreter circuit are configured so that the non-volatile memory device is a FLASH EEPROM.

20. A method for managing a finite state machine through an input arbitration circuit that stores commands to be executed, and provides a clock to the finite state machine, the method comprising:

a) for each new command, verifying whether it is received while the finite state machine is carrying out a previous command;

b) if step a) is negative, then issuing the new command to the finite state machine in real time, and restarting a new cycle from step a);

c) if step a) is positive, then verifying whether the new command can be ignored; and d) if step c) is negative, then storing the new command in the input arbitration circuit, waiting for the finite state machine to end execution of the previous command, issuing a deferred command to the finite state machine, and erasing the new command from the input arbitration circuit.

21. A method according to claim 20, wherein in step b), the new command comprises the clock if the command is provided by external circuitry, and comprises input data and the clock if the command is provided by internal circuitry.

22. A method according to claim 20, wherein in step d), the deferred command comprises input data and the clock.

23. A method according to claim 20, wherein the input arbitration circuit also provides a reset to the finite state machine.

24. A method according to claim 20, wherein the input arbitration circuit comprises a memory buffer for storing the commands to be executed.

25. A method according to claim 20, wherein the input arbitration circuit comprises at least one of a plurality of logic and memory bistable circuits connected together for forming a plurality of distinct signal paths with external circuitry and with internal circuitry.

* * * * *

UNITED STATES PATENT AND TRADEMARK OFFICE
CERTIFICATE OF CORRECTION

PATENT NO. : 7,284,144 B2  Page 1 of 1
APPLICATION NO. : 10/309759
DATED : October 16, 2007
INVENTOR(S) : Surico It is certified that error appears in the above-identified patent and that said Letters Patent is hereby corrected as shown below:

Column 9, Line 16        Delete: "hardly-exist"
                         Insert: -- hardly exist --

Column 10, Line 44       Delete: "SENSITIVITE"
                         Insert: -- SENSITIVE --

Column 10, Line 47       Delete: "it"
                         Insert: -- it's --

Column 16, Line 65       Delete: "and an arbitration circuit connected to"
                         Insert: -- and
                                 an arbitration circuit connected to --

Signed and Sealed this

First Day of July, 2008

JON W. DUDAS
*Director of the United States Patent and Trademark Office*